United States Patent
Lin et al.

(10) Patent No.: US 11,194,515 B2
(45) Date of Patent: Dec. 7, 2021

(54) MEMORY SYSTEM, METHOD OF OPERATING MEMORY, AND NON-TRANSITORY COMPUTER READABLE STORAGE MEDIUM

(71) Applicant: MACRONIX INTERNATIONAL CO., LTD., Hsinchu (TW)

(72) Inventors: Ping-Hsien Lin, Taipei (TW); Wei-Chen Wang, Taipei (TW); Hsiang-Pang Li, Zhubei (TW); Shu-Hsien Liao, Taoyuan (TW); Che-Wei Tsao, Yuanlin (TW); Yuan-Hao Chang, Taipei (TW); Tei-Wei Kuo, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 206 days.

(21) Appl. No.: 16/571,249

(22) Filed: Sep. 16, 2019

(65) Prior Publication Data
US 2021/0081140 A1 Mar. 18, 2021

(51) Int. Cl.
*G06F 3/06* (2006.01)
*G11C 16/10* (2006.01)

(52) U.S. Cl.
CPC .......... *G06F 3/0659* (2013.01); *G06F 3/0604* (2013.01); *G06F 3/064* (2013.01); *G06F 3/0679* (2013.01); *G11C 16/10* (2013.01)

(58) Field of Classification Search
CPC ...... G06F 3/0659; G06F 3/0604; G06F 3/064; G06F 3/0679; G11C 16/10
See application file for complete search history.

(56) References Cited

U.S. PATENT DOCUMENTS 7,516,283 B2 4/2009 Nonaka et al.
9,514,038 B2 * 12/2016 Okin .................. G06F 12/06
(Continued)

FOREIGN PATENT DOCUMENTS

TW I270076 B 1/2007
TW 201211764 A 3/2012
(Continued)

OTHER PUBLICATIONS

Won, Samkyu, et al. "Page overwriting method for performance improvement of NAND flash memories." IEICE Electronics Express 10.6 (2013): 20130039-20130039. (Year: 2013).*
(Continued)

*Primary Examiner* — Francisco A Grullon
(74) *Attorney, Agent, or Firm* — McClure, Qualey & Rodack, LLP (57) ABSTRACT

The present disclosure provides a memory system, a method of operating memory, and a non-transitory computer readable storage medium. The memory system includes a memory chip and a controller. The controller is coupled with the memory chip, which the controller is configured to: receive a first data corresponding to a first version from a file system in order to store the first data corresponding to the first version in a first page of the flash memory chip; and program the first data corresponding to a second version in the first page in response to the first data of the second version, which the second version is newer than the first version.

15 Claims, 7 Drawing Sheets

(56) References Cited

U.S. PATENT DOCUMENTS

| | | | |
|---|---|---|---|
| 2005/0144358 A1* | 6/2005 | Conley | G06F 12/0246 |
| | | | 711/103 |
| 2011/0258370 A1 | 10/2011 | Sharon et al. | |
| 2012/0033505 A1 | 2/2012 | Sekine et al. | |
| 2012/0243310 A1* | 9/2012 | Huang | G11C 16/3454 |
| | | | 365/185.03 |
| 2013/0311710 A1* | 11/2013 | Yang | G11C 16/22 |
| | | | 711/103 |
| 2015/0193302 A1* | 7/2015 | Hyun | G06F 11/108 |
| | | | 714/764 |
| 2016/0148694 A1* | 5/2016 | Chang | G11C 16/08 |
| | | | 365/185.03 |
| 2016/0210070 A1 | 7/2016 | Kurafuji et al. | |
| 2017/0115890 A1* | 4/2017 | Devendrappa | G06F 3/0679 |
| 2017/0147217 A1* | 5/2017 | Chang | G06F 3/0659 |
| 2017/0148526 A1* | 5/2017 | Li | G11C 11/5642 |
| 2018/0011632 A1 | 1/2018 | Kaluzhny | |
| 2018/0293028 A1* | 10/2018 | Abali | G06F 3/0604 |
| 2021/0149575 A1* | 5/2021 | Wallace | G06F 3/0616 |

FOREIGN PATENT DOCUMENTS

| | | |
|---|---|---|
| TW | I545587 B | 8/2016 |
| TW | I608352 B | 12/2017 |

OTHER PUBLICATIONS

TW Office Action dated Feb. 17, 2020 in Taiwan application (No. 108133277).

\* cited by examiner

MEMORY SYSTEM, METHOD OF OPERATING MEMORY, AND NON-TRANSITORY COMPUTER READABLE STORAGE MEDIUM

BACKGROUND

Technical Field

The disclosure relates to a memory and an operating method thereof. More particularly, the disclosure relates to a memory system and operating method thereof.

Description of Related Art

Base on the hardware specification of the flash memory, the aspects of data programming and data erasing times should be managed. On one hand, when the flash memory reads/writes data frequently, the life cycle of the electronic component is reduced fast. On the other hand, for promoting the data density of the flash memory, the architectures such as the multi-level cell is provides such that many bits can be stored in one memory cell. The amount of stored data is increase and the hardware cost is decreased in the multi-level cell architecture. However, the requirements for error correcting code are relatively increased in the architecture.

Accordingly, based on the electronic characteristics of the flash memory, how to effectively overcome the decline in life cycle and to reduce the error correction requirements is the problem need to be solved.

SUMMARY

An aspect of the present disclosure is to provide a memory system. The memory system comprises a memory chip and a controller. The controller is coupled to the memory chip, wherein the controller is configured to: receive a first data corresponding to a first version from a file system, and to store the first data corresponding to the first version in a first page of the memory chip; and program the first data corresponding to a second version to the first page in response to the second version of the data, wherein the second version is newer than the first version.

Another aspect of the present disclosure is to provide a method of operating memory. The method of operating memory comprises steps of receiving a first data corresponding to a first version from a file system, and storing, by a controller, the first data corresponding to the first version in a first page of a memory chip; and programming the first data corresponding to a second version to the first page in response to the second version of the first data, wherein the second version is newer than the first version.

Another aspect of the present disclosure is to provide a non-transitory computer readable storage medium, comprising instructions stored thereon, the instructions being configured to cause a controller to: receiving a data corresponding to a first version from a file system, and storing, by a controller, the data corresponding to the first version in a first page of a memory chip; and programming the data corresponding to a second version to the first page in response to the second version of the data, wherein the second version is newer than the first version.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

It will be understood that, in the description herein and throughout the claims that follow, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Moreover, "electrically connect" or "connect" can further refer to the interoperation or interaction between two or more elements.

It will be understood that, in the description herein and throughout the claims that follow, although the terms "first," "second," etc. may be used to describe various elements, these elements should not be limited by these terms. These terms are only used to distinguish one element from another. For example, a first element could be termed a second element, and, similarly, a second element could be termed a first element, without departing from the scope of the embodiments.

It will be understood that, in the description herein and throughout the claims that follow, the phrase "and/or" includes any and all combinations of one or more of the associated listed items.

It should be noted that, in the description herein and throughout the claims that follow, the phrase "store", "write", and "program" may be used interchangeably, and these phrases should be deemed the same/similar meaning with others.

Figure 1:
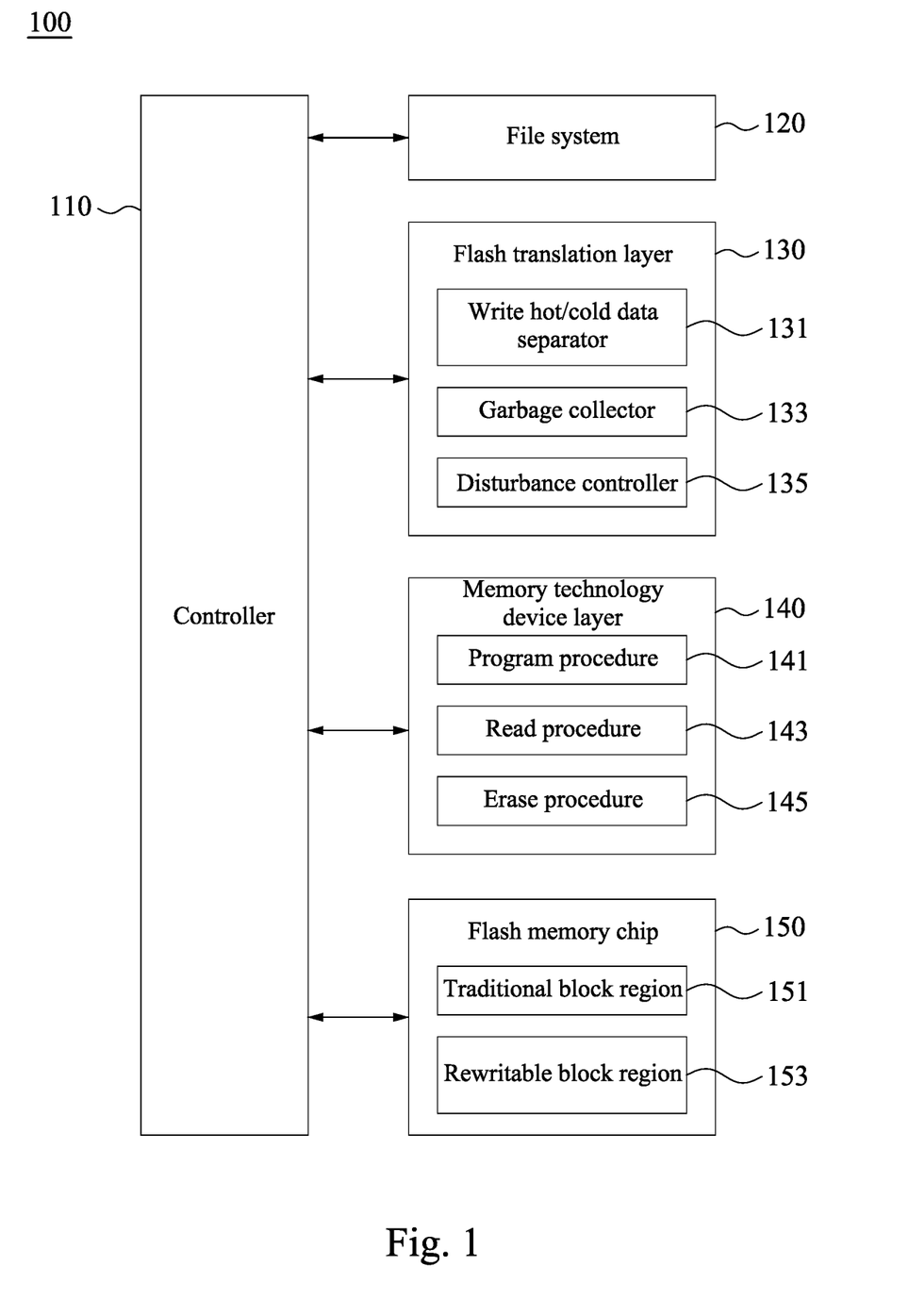
FIG. 1 is a functional block diagram illustrating a memory system according to some embodiments of the disclosure.

Reference is made to FIG. 1. FIG. 1 is a functional block diagram illustrating a memory system 100 according to some embodiments of the disclosure. As shown in FIG. 1, the memory system 100 includes a controller 110, a file system 120, a flash translation layer 130, a memory technology device layer 140, and a flash memory chip 150. In some embodiments, the controller 110 is configured to operate the file system 120, flash translation layer 130, memory technology device layer 140, and a flash memory chip 150. The operations above can be but not limited to hardware operations, firmware operations, software operations, and the combinations thereof.

The controller 110 is coupled to the flash memory chip 150. In one embodiment, the controller 110 is configured to operate the flash memory chip 150 to program, read, and erase the flash memory chip 150. In another embodiment, the controller 110 is configured to manage the space distribution and program/erase cycles of the flash memory chip 150. The controller 110 can be but not limited to the control circuit or control chip packaged in the memory chip.

In one embodiment, the flash memory chip 150 can be but not limited to the NAND flash memory chip. The architecture of the flash memory chip 150 can be but not limited to the single-level cell (SLC), the multi-level (MLC), the triple-level cell (TLC), and the quad-level cell (QLC).

The memory technology device layer 140 is configured to operate the flash translation layer 130 and the flash memory chip 150. For example, the memory technology device layer 140 can be but not limited to the firmware communicative between the flash translation layer 130 and the flash memory chip 150. In some embodiments, the memory technology device layer 140 is configured to execute a program procedure 141, a read procedure 143, and an erase procedure 145. In some embodiments, a rewritable block table is stored in the memory technology device layer 140. The rewritable block table stores the times that each page is executed the page rewriting. These procedures will be illustrated below.

The flash translation layer 130 is configured to execute software operations for data of the file system 120. In some embodiments, the flash translation layer 130 includes a write hot/cold data separator 131, a garbage collector 133, and a disturbance controller 135.

The write hot/cold data separator 131 is configured to analyze the data type which data is to be written into the flash memory chip 150, the data type is, for example, a hot data (or frequently accessed data) and a cold data (or infrequently accessed data). The processes that the write hot/cold data separator 131 determines the data type can be but not limited to the hash function), the least recently used, etc. The present disclosure is not limited herein, and other procedures which are not stated here for determining the hot data/cold data are also included in the scope.

The flash memory chip 150 includes a traditional block region 151 and a rewritable block region 153. In some embodiments, when the write hot/cold data separator 131 determines that the data is the cold data, the controller 110 stores, through the program procedure 141 of the memory technology device layer 140, the data in the traditional block region 151. In another embodiment, when the write hot/cold data separator 131 determines that the data is the hot data, the controller 110 stores, through the program procedure 141 of the memory technology device layer 140, the data in the rewritable block region 153.

The garbage collector 133 is configured to manage the block erasure of the flash memory chip 150. In some embodiments, the garbage collector 133 can be a software procedure, and the controller 110 executes the software procedure and applies voltages at the flash memory chip 150 to perform the data erasure.

The disturbance controller 135 is configured to manage the disturbance of each page of the flash memory chip 150. In some embodiments, the disturbance controller 135 can be a software procedure, and the controller 110 executes the software procedure to solve the disturbance problem of each page.

Figure 2:
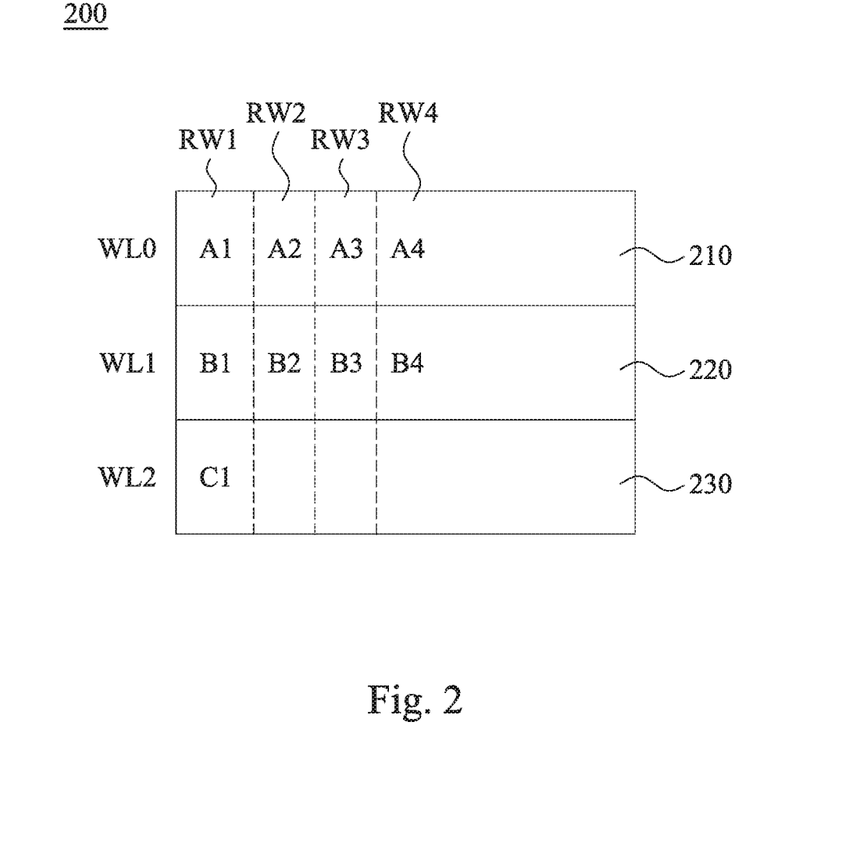
FIG. 2 is an illustration of rewriting data to a block of a flash memory chip of memory system in FIG. 1.

Reference is made to FIG. 2. FIG. 2 is an illustration of rewriting data to a block 200 of a flash memory chip 150 of memory system 100 in FIG. 1. For illustrating the rewriting data procedure, taking the block having three pages, and each page having one memory cell as an example, whereas the present disclosure is not limited to the above example. For instance, one block includes a plurality of pages which may be more than three pages (such as 256 pages), and each page includes one or more memory cells (such as 32768 memory cells), the scenario is also included in the document.

As shown in FIG. 2, the block 200 includes pages 210, 220, 230, and word lines WL0, WL1, WL2. The word line WL0 is configured to control the procedures for data reading/writing at the page 210. The word line WL1 is configured to control the procedures for data reading/writing at the page 220. The word line WL2 is configured to control the procedures for data reading/writing at the page 230. In the embodiment, each of the pages 210, 220, and 230 comprises one memory cell, which the memory cell is configured to store one-bit data.

In the example, the rewriting data procedure is suitable for storing the hot data. For example, if there is one data having been stored on the page, and the data is re-executed such that a new version data is generated. In the present disclosure, the original page which stores the data will not be erased before the new version data is stored at the original page. Instead, the new version data is stored at the page by increasing the voltage level for storing data.

Figure 3A:
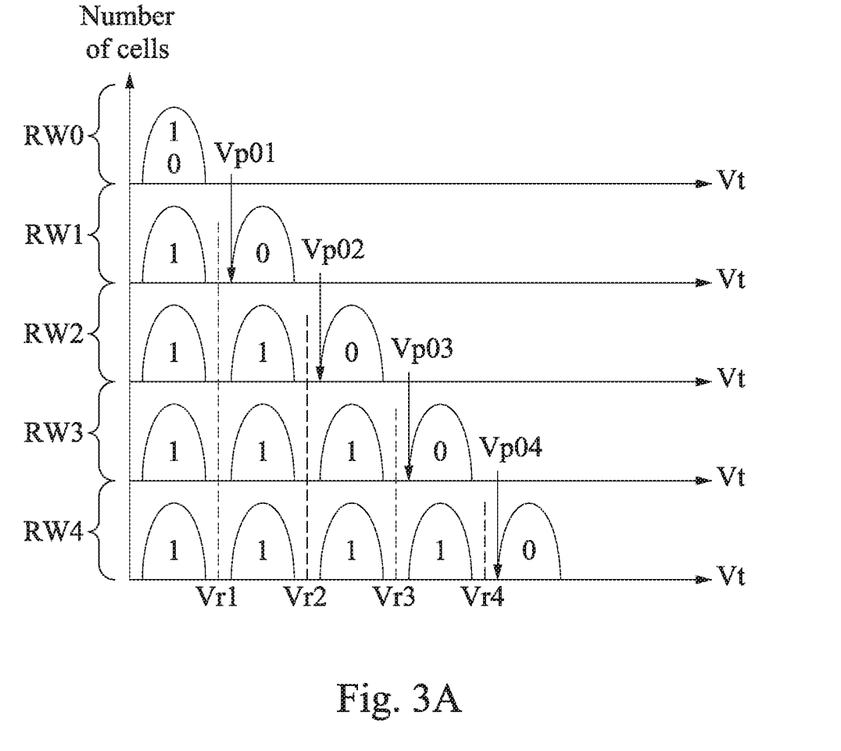
FIG. 3A is an illustration of threshold voltage and a number of cells when data are programmed to pages of the block in FIG. 2 according to some embodiments of the disclosure.
Figure 3B:
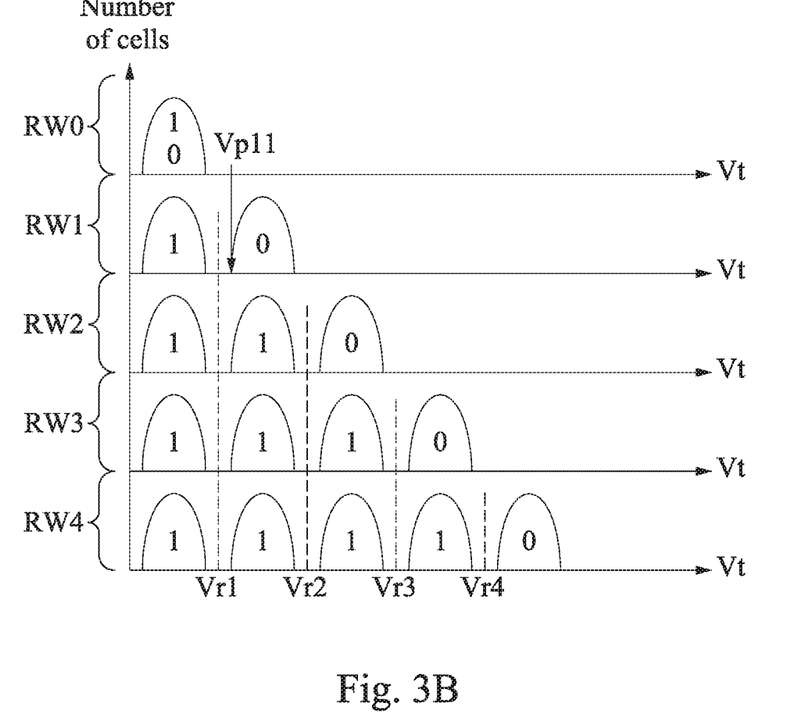
FIG. 3B is an illustration of threshold voltage and the number of cells when data are programmed to pages of the block in FIG. 2 according to some embodiments of the disclosure.
Figure 3C:
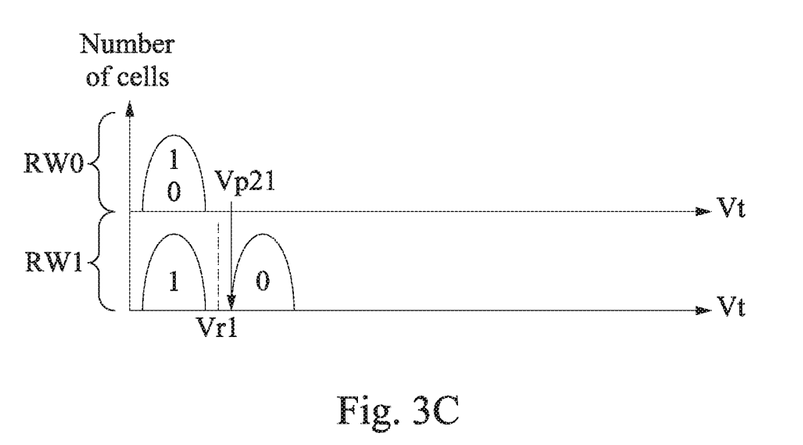
FIG. 3C is an illustration of threshold voltage and the number of cells when data are programmed to pages of the block in FIG. 2 according to some embodiments of the disclosure.
Figure 4:
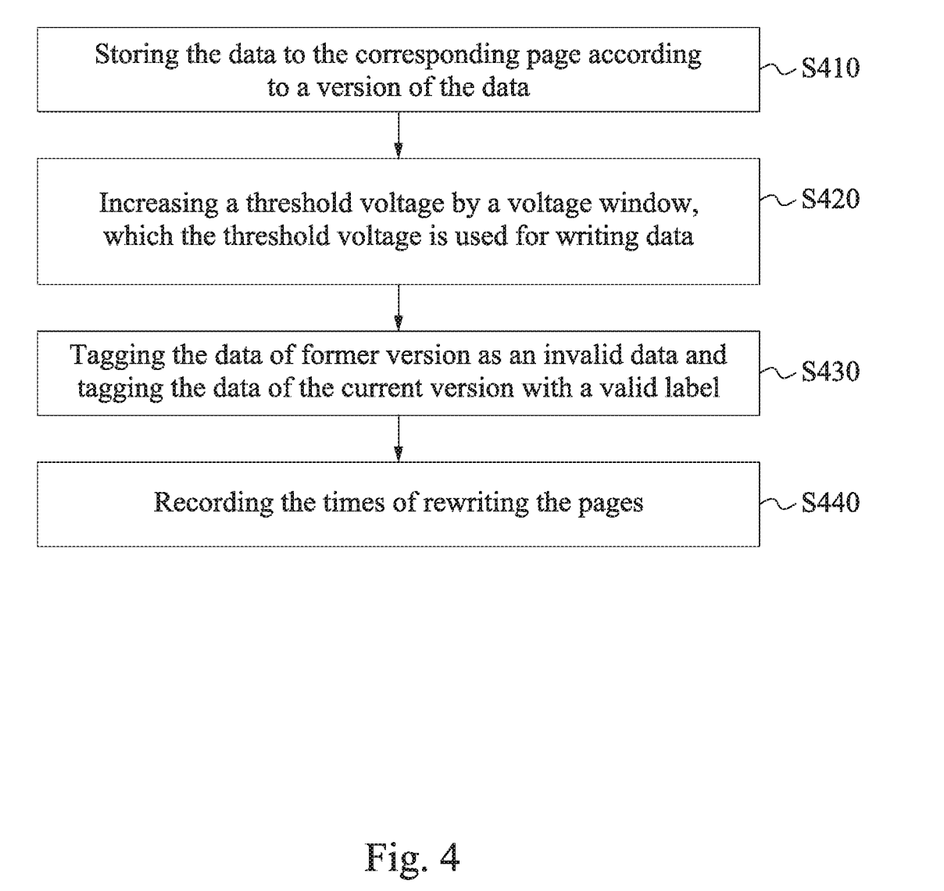
FIG. 4 is a flow chart illustrating a rewriting method according to some embodiments of the disclosure.

For further illustrating the rewriting data procedure, reference is made to FIG. 4. FIG. 4 is a flow chart illustrating a rewriting method according to some embodiments of the disclosure. Further, reference is made incorporating with FIG. 1, FIG. 2, and FIG. 3A~3C for further illustrations. It should be noted that each of the pages 210, 220, and 230 in FIG. 2 corresponds to the word lines WL0, WL1, and WL2 respectively. The page 210 is configured to store the first data A1 and its new version(s). The page 220 is configured to store the second data B1 and its new version(s). The page 230 is configured to store the third data C1 and its new version(s). The symbol "A1" of the first data represents the first version of the first data. The symbol "A2" of the first data represents the second version of the first data. The symbol "A3" of the first data represents the third version of the first data, and so on. In some embodiments, the second version is newer than the first version, and the third version is newer than the second version. In the document, taking three-time updates as an example, however, it should not be limited herein.

In the operation S410, storing, by the controller 110, the data to the corresponding page according to the version of the data. For example, as shown in FIG. 2, when the first data A1 is to be programmed to the block 200, the controller 110 controls the word line WL0 according to the rewriting instruction RW1 such that the first data A1 is stored in the page 210, which the first data A1 corresponds to the first version. In another embodiment, when the first data A2 is to be programmed to the block 200, the controller 110 controls the word line RW2 according to the rewriting instruction RW2 such that the first data A2 is stored in the page 210, which the first data A2 corresponds to the second version.

In the operation S420, increasing a threshold voltage by a voltage window, which the threshold voltage is used for writing data. Accordingly, the threshold voltage is also called 'verify voltage'. Reference is made to FIG. 3A. FIG. 3A is an illustration of threshold voltage and a number of cells when data are programmed to the page 210 of the block 200 in FIG. 2 according to some embodiments of the disclosure. Before any data is programmed to the memory cells, the logic value of the memory cells is shown as the stage RW0, and the memory cells are in the erase state. In one embodiment, the logic value of the memory cells is defined as a first logic value, such as the value "1". When the first data A1 is written to the page 210, as shown in FIG. 3A, the threshold voltage corresponding to the rewriting instruction RW1 is increased to a voltage Vp01, which the verify voltage is used to determine whether the voltage that programs data is within a predicted range or not. For example, after the first data A1 is written to the page 210 and the threshold voltage is increased to the voltage Vp01, the voltage Vp01 will be read as the verify voltage in order to verify whether the first data A1 is written to the page 210 correctly or not. Accordingly, if threshold voltage of the memory cell of the first data A1 is determined to be within the predicted range, such as the voltage Vp01, the first data A1 is correctly written to the page 210.

Furthermore, the logic value of the memory cells which belongs to a voltage range prior to the voltage Vp01 is defined as the first logic value, such as the value "1". The logic value of the memory cells which belongs to the voltage range behind the voltage Vp01 is defined as a second logic value, such as the value "0". The first data A1 is stored in the page 210 at this moment. In the case that the first data A1 is the newest version, the controller 110 can read the correct-version data by reading a reading voltage Vr1 when operating the reading procedure 143 in order to read the first data A1.

Similarly, when the first data is updated from the first data A1 to the first data A2, the first data A2 is to be programmed to the page 210, as shown in FIG. 3A, the threshold voltage corresponding to the rewriting instruction RW2 is increased to the voltage Vp02. The logic value of the memory cells which belongs to a voltage range prior to the voltage Vp02 is defined as the first logic value, such as the value "1". The logic value of the memory cells which belongs to the voltage range behind the voltage Vp02 is defined as the second logic value, such as the value "0". The first data A2 is stored in the page 210 at this moment. In the case that the first data A2 is the newest version stored in the page 210, the controller 110 can read the correct-version data by reading a reading voltage Vr2 when operating the reading procedure 143 in order to read the first data A2.

In the operation S430, tagging the data of the former version with the invalid label (which represents the invalid data) and tagging the data of the current (newest) version with the valid label (which represents the valid data). For example, as shown in FIG. 2, the controller 110 reads the first data A1 and then executes the first data A1 to generate the first data A2. At this time, the first data A2 is the newest-version data, and the first data A1 is the former-version data. Hence, the first data A2 is tagged with the valid label which represents the valid data, and the first data A1 is tagged with the invalid label which represents the invalid data.

In the operation S440, the controller 110 recodes the times of rewriting the pages. For example, in the operation S430, when the first data A1 is updated to the first data A2, the controller 110 records the times of rewriting the page 210 as two.

Similarly, if the first data A2 is updated afterwards (such as updated to the first data A3), the newer version content will be stored in the page 210, and the voltage Vp02 is added with the voltage window according to the rewriting instruction RW3 such that the threshold voltage is increased to the voltage Vp03. The logic value of the memory cells which belongs to a voltage range prior to the voltage Vp03 is defined as the first logic value, such as the value "1". The logic value of the memory cells which belongs to the voltage range behind the voltage Vp03 is defined as the second logic value, such as the value "0". The first data A3 is tagged with the valid label, and the first data A2 is tagged with the invalid label. The controller 110 records the times of rewriting the page 210 as three. The controller 110 can read the correct-version of the first data A3 by reading a reading voltage Vr3.

Further, if the first data A3 is updated afterwards (such as updated to the first data A4), the newer version content will be stored in the page 210, and the voltage Vp03 is added with the voltage window according to the rewriting instruction RW4 such that the threshold voltage is increased to the voltage Vp04. The logic value of the memory cells which belongs to a voltage range prior to the voltage Vp04 is defined as the first logic value, such as the value "1". The logic value of the memory cells which belongs to the voltage range behind the voltage Vp04 is defined as the second logic value, such as the value "0". The first data A4 is tagged with the valid label, and the first data A3 is tagged with the invalid label. The controller 110 records the times of rewriting the page 210 as four. The controller 110 can read the correct-version of the first data A4 by reading a reading voltage Vr4.

Therefore, if the architecture of the flash memory chip 150 is the quad-level cell (QLC), each page can rewrite data at most 15 times. For example, every memory cell of the QLC memory architecture has at most 16 voltage states. While performing the operations S410~S440 repeatedly, one-bit data can be written to the page and one voltage window is added to the threshold at each operation. Hence, each page can be updated at most 15 times.

When the controller 110 reads the data, it is required to determine the two states of voltages to retrieve the newest-version data. For example, when the first data A1 is to be read, the controller 110 has to control to read the reading voltage Vr1 (shown as FIG. 3A) to access the correct data.

It should be noted that a look-up table is stored in the memory technology device layer 140. The look-up table is configured to store the relation between the verify voltages and the corresponding pages, and the verify voltage is mapped to the newest-version data. For example, if the newest-version data stored in the page 210 is the first data A1, the verify voltage corresponding to the page 210 stored in the look-up table is the voltage Vp01. Similarly, if the newest-version data stored in the page 210 is the first data A2, the verify voltage corresponding to the page 210 stored in the look-up table is the voltage Vp02. Accordingly, the controller 110 can obtain the verify voltage according to the look-up table, and read the newest-version data according to the reading voltage.

Hence, repeating (optionally) executing the operations S410~440, the order of writing data to the block 200 in FIG. 2 is shown as below: the second data B1, the second data B2, the third data C1, the first data A3, the first data A4, the second data B3, the second data B4.

When the second data B1 is to be programmed to the block 200, the controller 110 controls the word line WL2 according to the rewriting instruction RW1 in order that the second data B1 is stored in the page 220, which the second data B1 corresponds to the first version.

On the other hand, reference is made to FIG. 3B. FIG. 3B is an illustration of threshold voltage and the number of cells when data are programmed to the page 220 of the block 200 in FIG. 2 according to some embodiments of the disclosure. Before any data is programmed to the memory cells, the logic value of the memory cells is shown as the stage RW0, and the memory cells are in the erase state. In one embodiment, the logic value of the memory cells is defined as the first logic value, such as the value "1". When the second data B1 is written to the page 220, as shown in FIG. 3B, the threshold voltage corresponding to the rewriting instruction RW1 is increased to a voltage Vp11. The logic value of the memory cells which belongs to the voltage range prior to the voltage Vp11 is defined as the first logic value, such as the value "1". The logic value of the memory cells which belongs to the voltage range behind the voltage Vp11 is defined as the second logic value, such as the value "0". The controller 110 records the times of rewriting the page 220 as one.

When the controller 110 reads the data, it is required to determine the two states of voltages to retrieve the newest-version data. For example, when the second data B1 is to be read, the controller 110 has to control to read the reading voltage Vr1 (shown as FIG. 3B) to access the correct data. The procedures of updating and reading the second data B1 are similar with the illustrations of FIG. 3A and the illustrations of the procedures are not repeated herein.

When the third data C1 is to be programmed to the block 200, the controller 110 controls the word line WL3 according to the rewriting instruction RW1 such that the third data C1 is stored in the page 230, which the third data C1 corresponds to the first version.

On the other hand, reference is made to FIG. 3C. FIG. 3C is an illustration of threshold voltage and the number of cells when data are programmed to the page 230 of the block 200 in FIG. 2 according to some embodiments of the disclosure. Before any data is programmed to the memory cells, the logic value of the memory cells is shown as the stage RW0, and the memory cells are in the erase state. In one embodiment, the logic value of the memory cells is defined as the first logic value, such as the value "1". When the third data C1 is written to the page 230, as shown in FIG. 3C, the threshold voltage corresponding to the rewriting instruction RW1 is increased to a voltage Vp21. The logic value of the memory cells which belongs to the voltage range prior to the voltage Vp21 is defined as the first logic value, such as the value "1". The logic value of the memory cells which belongs to the voltage range behind the voltage Vp21 is defined as the second logic value, such as the value "0". The controller 110 records the times of rewriting the page 230 as one.

When the controller 110 reads the data, it is required to determine the two states of voltages to retrieve the newest-version data. For example, when the third data C1 is to be read, the controller 110 has to control to read the reading voltage Vr1 (shown as FIG. 3C) to access the correct data.

The traditional programming method, that is, the incremental step pulse programming (ISPP) programming method, each memory cell can be only programmed four times taking the QLC architecture as an example. When the written data is the hot data, which is updated frequently, the memory cell storing the hot data cannot execute any programming procedure after four-time programming. This results in very low using efficiency of the memory chip. In contrast to the traditional method, the method for rewriting data at the flash memory chip 150 of the disclosure increases the times of updating the hot data in the memory cell to at most 15 times and increases the programming efficiency. Accordingly, in contrast to the traditional method, the disclosure achieves beneficial effect for promoting the data-programming efficiency in the multi-level cell architecture of the memory chip.

On the other hand, due to increments of rewritten times for each memory cell, the total byte written (TWB) of the memory cell will be increased in the case of the same program/erase cycle in the disclosure. In addition, in the case of the same total byte written, the program/erase cycle of each memory block will be reduced in the disclosure. Accordingly, the memory chip can use the error correction code whose used-frequency can be reduced in order to reduce the cost that the memory chip processes the error correction code and to achieve better holistic performance and outstanding effect.

Furthermore, the method for rewriting data at the flash memory chip 150 provides the procedures without erasing old data while updating the data. Instead, the entire block is erased just when the ratio of invalid data in the block is larger than a threshold. Therefore, it can be avoided that the some specific pages update data frequently arising the problem that pages are worn.

Further, when the controller 110 reads the data, it is required to determine the two states of voltages to retrieve the newest-version data. Comparing with the traditional page-writing procedure, the traditional page-writing procedure needs to record 4 or more verify voltages to read the data corresponding to each voltage range. The wrong data will be read if some mistakes occur during controlling the voltages. In the present disclosure, multi-level cell architecture is applied to store the same data with different update version. One page stores one data at once, whereas the same page can be used to store data for updating repeatedly. Therefore, the complexity of reading and writing data can be reduced.

Figure 5:
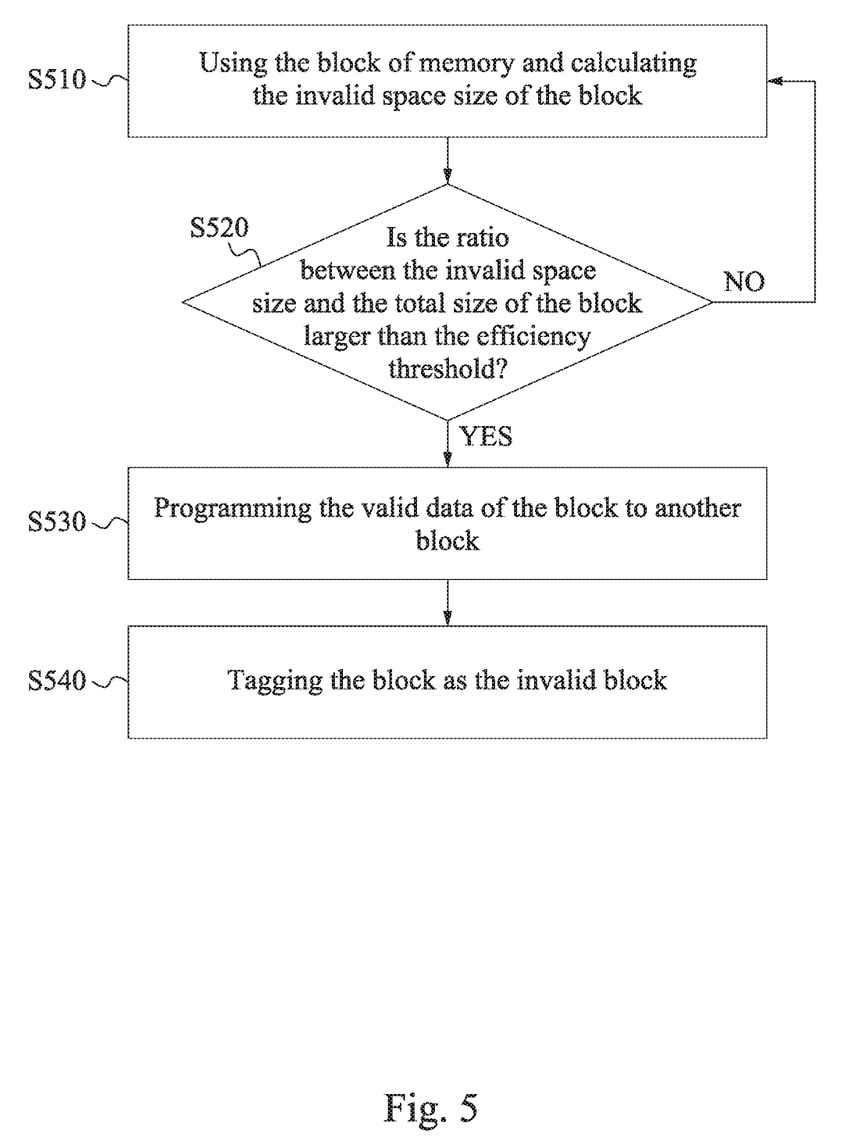
FIG. 5 is a flow chart illustrating a garbage collecting method according to some embodiments of the disclosure.

Reference is made to FIG. 5. FIG. 5 is a flow chart illustrating a garbage collecting method according to some embodiments of the disclosure. Please refer to FIG. 5 incorporating with FIG. 1 and FIG. 2.

In the operation S510, the controller 110 uses the block 200, and the garbage collector 133 calculates the invalid space size of the block 200.

Taking the block 200 having three pages 210, 220, 230 and each of them having one memory cell as an example. If the memory cell is the QLC architecture, in the case that one bit is stored at one time, one page can rewrite data at most 15 times while executing the operations S410~S440 of FIG. 4. Hence, the total size of the block 200 is 45(15*3). On the other hand, the valid data of the block 200 in FIG. 2 are the first data A4, the second data B4, and the third data C1. The invalid space size is 6 (that is, the first data A1, A2, A3, and the second data B1, B2, B3 which are tagged with the invalid label).

It should be noted that the rewritable block table of the memory technology device layer 140 records a rewrite count of blocks. For example, the block 200 of FIG. 2 has been written data for 9 times, and the rewrite count of the block 200 in the rewritable block table is 9. In some embodiments, the rewrite count of the block 200 can be but not limited to the sum of rewrite counts of the page 210, 220, and 230.

In the operation S520, the controller 110 determines whether the ratio between the invalid space size and the total size of the block is larger than the efficiency threshold.

Taking the block 200 shown in FIG. 2 as an example, the ratio between the invalid space size and the total size is about 13%, it represents that the residual usable space of the block 200 is sufficient, and the block 200 can still be used. It should be noted that the ratio is not limited to the above example, the ratio can be set according to actual demands, for example, the efficiency threshold is set as the ratio 95%, which represents the usage of the block 200 is increased. In another embodiment, the times of rewriting data of each page in the block 200 can be set as 7 by the controller 110, so the total space is 21. As shown in FIG. 2, the storage status of the block 200, i.e. 6 invalid data, so the ratio between the invalid space size and the total size is about 29%, that is to say, the times of rewriting at each page influences the maximum times of rewriting data at the block.

In the operation S520, if the ratio between the invalid space size and the total size is not more than the efficiency threshold, back to operation S510. If the ratio between the invalid space size and the total size is more than the efficiency threshold, going on the operation S530.

In the operation S530, the valid data of the block 200 is/are programmed to another block (not shown in FIG. 2) by the controller 110.

For example, the valid data of the block 200 is the first data A4, the second data B4, and the third data C1. Hence, these data are programmed (or moved) to another empty block.

Then, in the operation S540, the controller 110 tags the block 200 with the invalid label. Therefore, the controller 110 will not read the data in the block 200, neither writes data to the block 200. In some embodiments, in the case that the space of the block 200 is claimed, the data in the block 200 are just erased.

Figure 6:
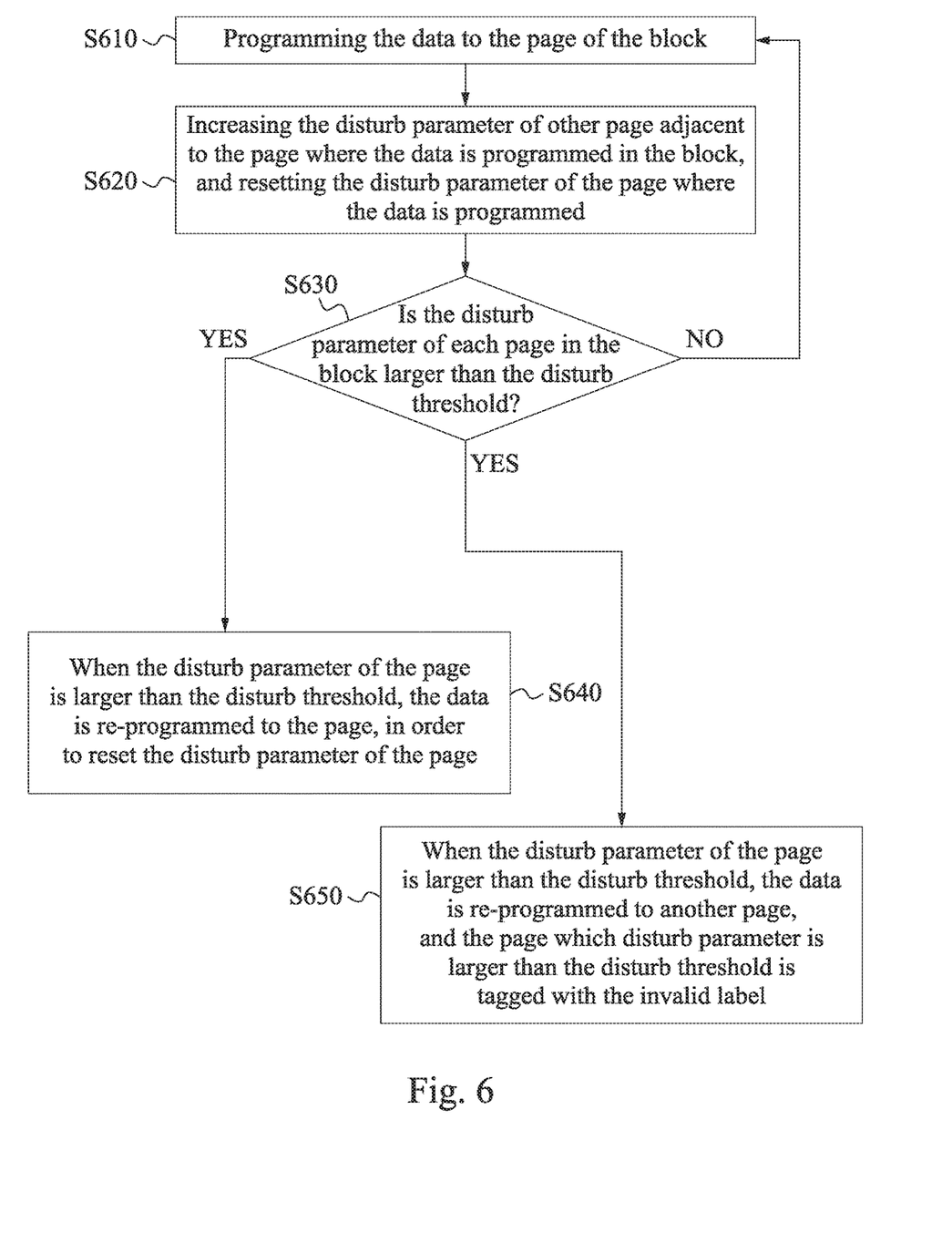
FIG. 6 is a flow chart illustrating a disturb detecting method for programming according to some embodiments of the disclosure.

Reference is made to FIG. 6. FIG. 6 is a flow chart illustrating a disturb detecting method for programming according to some embodiments of the disclosure. Further, reference is made incorporating with FIG. 1, FIG. 2, and FIG. 6 for clear understanding.

In the operation S610, the controller 110 programs the data to the page of the block 200. For example, the second data B1 is written to the page 220, the operation has been described above.

Then, in the operation S620, the disturbance controller 135 increases the disturb factor of the page(s) (such as the page 220), which is/are adjacent the other pages (such as the page 210 and page 230) executing data programming in the block 200, and resets the disturb parameter of the page where the data is programmed.

For example, taking the block 200 stores the first data A1 as an example. The page 220 and the page 230 do not stored any data yet. At this time, the disturb parameter of the page 210 is reset as 0, and the disturb parameter of the page 220 is increased from 0 to 1 (if the disturb parameter of every page is 0 at first). If the second data A2 is the next data to be written to the page 210, the disturb parameter of the page 210 is reset as 0, and the disturb parameter of the page 220 is increased from 1 to 2.

Next, when the second data B1 is written to the page 220, the disturb parameters of the page 210 and the page 230, which are adjacent to the page 220, are increased from 0 to 1. Further, the disturb parameter of the page 220 is reset as 0. As the similar statements, when the order sequence of rewriting data is <A1, A2, B1, B2, C1, A3, A4, B3, B4>, the final disturb parameter of the page 210 is 2, that of the page 220 is 0, and that of the page 230 is 2.

In the operation S630, it is determined whether the disturb parameter of every page in the block 200 is larger than the disturb threshold.

Taking the disturb threshold being 1 as an example, the disturb parameters of the page 210 and that of the page 230 are both larger than the disturb threshold.

Then, in the operation S640, when the disturb parameter of the page is larger than the disturb threshold, the data is re-programmed to the page, in order to reset the disturb parameter of the page.

For example, as shown in FIG. 2, the disturb parameters of the pages 210 and 230 are larger than the disturb threshold. At this time, the first data A4 is re-programmed to the page 210, in order to reset the disturb parameter of the page 210. Similarly, the third data C1 is re-programmed to the page 230, in order to reset the disturb parameter of the page 230.

On the other hand, when the disturb parameter is larger than the disturb threshold, the operation following the operation S630 can be the operation S650. In the operation S650, when the disturb parameter of the page is larger than the disturb threshold, the data is re-programmed to another page, and the page whose disturb parameter is larger than the disturb threshold is tagged with the invalid label.

For example, as shown in FIG. 2, the first data A4 is stored in the page 210 and the third data C1 is stored in the page at this time. When the disturb parameters of the page 210 is larger than the disturb threshold, the first data A1 will be re-written (or re-programmed) to another empty page (not shown in FIG. 2), and the page 210 is tagged with the invalid label. Similarly, when the disturb parameters of the page 230 is larger than the disturb threshold, the third data C1 will be re-written to another empty page (not shown in FIG. 2), and the page 230 is tagged with the invalid label.

It should be noted that, in the operation S630, when the disturb parameter of the page is larger than the disturb threshold, the operations S640 and S650 are the two options following the operation S630. Each of the operations S640 and S650 can process the disturb problem, including the excessively high disturb parameters.

Referring to the operation S630 again, when the disturb parameter of the page 220 is less than the disturb threshold, going back to the operation S610, and continuing to use the page.

In some embodiments, the present disclosure provides a non-transitory computer readable medium which stores a plurality of instructions. After the instructions are loaded into the controller 110 in FIG. 1, the controller 110 executes the instructions and performs the operations in FIG. 4, FIG. 5, and FIG. 6. For example, the controller 110 receives the data and stores the data to the corresponding page according to the version of the data, the controller 110 increases, by shifting the voltage window, the threshold voltage which can be used as the voltage for programming data, the controller 110 tags the former-version data with the invalid label and tags the newer-version data with the valid label, and the controller 110 records the times of rewriting data at each page.

The present disclosure provides the disturb-detection method for the flash memory chip 150 while programming procedure is executed, and the disturbance of the pages adjacent to other pages can be detected, and it can be avoided from the frequently accessing the same data at the same page, in order to maintain the data correctness of the pages.

As illustrated above, the memory system and the method for operating the memory provides the means of storing the hot data and the cold data in the memory chip, for example, they are stored in different memory regions. By means of threshold voltage increments for programming the hot data to the same page, the advantage of page granularity is provided. Hence, the data erasing frequency of the block can be reduced, and the reliability can be increased. The garbage collecting operations and the disturb detecting operations in the document can manage the writing scenario of the memory chip, for example, erasing memory at less erasing times as possible, and the data correctness of the memory can be maintained. Therefore, the reading, programming, and erasing life cycle of the memory chip can be enlarged.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory system, comprising:
a memory chip; and
a controller, coupled to the memory chip, wherein the controller is configured to:
receive a first version of a first data from a file system, and to store the first version of the first data in a first page of the memory chip;
program a second version of the first data to the first page of the memory chip in response to the second version of the first data being generated, wherein the second version is newer than the first version;
increase a threshold voltage by a voltage window; and
tag the first version of the first data with an invalid label, and tag the second version of the first data with a valid label.

2. The memory system of claim 1, wherein the controller is further configured to:
increase a rewrite count, in a rewritable block table, of a first block which the first page belongs to.

3. The memory system of claim 2, wherein the controller is further configured to calculate an invalid space size of the first block according to the rewrite count and to program the valid data of the first block to a second block of the memory chip, and to tag the first block with the invalid label when the controller determines that a ratio between the invalid space size of the first block and a total size of the first block is larger than an efficiency threshold.

4. The memory system of claim 1, wherein the controller is further configured to increase a disturb parameter of a second page in a first block and to reset the disturb parameter of the first page when the controller programs the first data to the first page of the first block, wherein the second page is adjacent to the first page.

5. The memory system of claim 4, wherein when the controller programs a second data to the second page in the first block, the controller is further configured to increase the disturb parameter of the first page in the first block, and when the disturb parameter of the first page is larger than a disturb threshold, the controller is further configured to re-program the first data to the first page in order to reset the disturb parameter of the first page.

6. The memory system of claim 4, wherein when the controller programs a second data to the second page in the first block, the controller is further configured to increase the disturb parameter of the first page in the first block, and when the disturb parameter of the first page is larger than a disturb threshold, the controller is further configured to re-program the first data to a third page of the first block and to tag the first page with the invalid label.

7. The memory system of claim 1, wherein the memory chip comprises a first block region and a second block region, wherein the controller is further configured to store a third data in the first block region of the memory chip when the third data is determined as a hot data, and the controller is further configured to store a fourth data in the second block region of the memory chip when the fourth data is determines as a cold data.

8. A method of operating memory, comprising:
receiving a first version of a first data from a file system, and storing, by a controller, the first version of the first data in a first page of a memory chip;
programming a second version of the first data to the first page of the memory chip in response to the second version of the first data being generated, wherein the second version is newer than the first version;
increase a threshold voltage by a voltage window; and
tag the first version of the first data with an invalid label, and tag the second version of the first data with a valid label.

9. The method of operating memory of claim 8, further comprising:
increasing a rewrite count, in a rewritable block table, of a first block which the first page belongs to.

10. The method of operating memory of claim 9, further comprising:
calculating an invalid space size of the first block according to the rewrite count; and
programming the valid data of the first block to a second block of the memory chip and tagging the first block with the invalid label when the controller determines that a ratio between the invalid space size of the first block and a total size of the first block is larger than an efficiency threshold.

11. The method of operating memory of claim 8, further comprising:
increasing a disturb parameter of a second page in a first block when the controller programs the first data to the first page of the first block; and
resetting the disturb parameter of the first page.

12. The method of operating memory of claim 11, further comprising:
increasing the disturb parameter of the first page in the first block in response to programming a second data to the second page in the first block; and
re-programming the first data to the first page in order to reset the disturb parameter of the first page when the disturb parameter of the first page is larger than a disturb threshold.

13. The method of operating memory of claim 11, further comprising:
re-programming the first data to a third page of the first block when the disturb parameter of the first page is larger than a disturb threshold; and
tagging the first page as the invalid data.

14. The method of operating memory of claim 8, further comprising:
storing a third data in a first block region of the memory chip when the third data is determined as a hot data; and storing a fourth data in a second block region of the memory chip when the forth data is determines as a cold data.

15. A non-transitory computer readable storage medium, comprising instructions stored thereon, the instructions being configured to cause a controller to:
receive a first version of a data from a file system, and storing, by a controller, the first version of the data in a first page of a memory chip;
program a second version of the data to the first page of the memory chip in response to the second version of the data being generated, wherein the second version is newer than the first version;
increase a threshold voltage by a voltage window; and
tag the first version of the data with an invalid label, and tag the second version of the data with a valid label.

* * * * *